United States Patent
Shieh et al.

(10) Patent No.: US 7,053,598 B2
(45) Date of Patent: May 30, 2006

(54) STRUCTURE FOR DETECTING PLUG/UNPLUG STATUS OF PHONE-JACKS BY SINGLE BIT GENERATED BY A RESISTOR NETWORK

(75) Inventors: Wen-Lung Shieh, Taipei (TW); Chih-Hung Tseng, Taipei (TW)

(73) Assignee: C-Media Electronics, Inc., Taipei (TW)

( * ) Notice: Subject to any disclaimer, the term of this patent is extended or adjusted under 35 U.S.C. 154(b) by 232 days.

(21) Appl. No.: 10/316,171

(22) Filed: Dec. 9, 2002

(65) Prior Publication Data

US 2004/0108845 A1 Jun. 10, 2004

(30) Foreign Application Priority Data

Dec. 4, 2002 (TW) ............................... 91135222 A

(51) Int. Cl.
*G01R 19/00* (2006.01)
(52) U.S. Cl. ...................................................... 324/66
(58) Field of Classification Search .................. 324/66, 324/537, 538, 756
See application file for complete search history.

(56) References Cited

U.S. PATENT DOCUMENTS

| | | | | |
|---|---|---|---|---|
| 4,445,047 A | * | 4/1984 | Cannon ........................ 307/31 |
| 4,493,951 A | * | 1/1985 | Sanderson et al. ............ 379/28 |
| 5,532,675 A | * | 7/1996 | White ........................ 340/515 |
| 5,886,530 A | * | 3/1999 | Fasnacht et al. ............ 324/611 |
| 6,201,383 B1 | * | 3/2001 | Lo et al. ..................... 324/73.1 |
| 6,590,374 B1 | * | 7/2003 | Har-Lev ...................... 324/66 |
| 6,750,643 B1 | * | 6/2004 | Hwang et al. ................ 324/86 |
| 2003/0025516 A1 | * | 2/2003 | Chao et al. .................. 324/756 |

* cited by examiner

*Primary Examiner*—Vincent Q. Nguyen
*Assistant Examiner*—Marina Kramskaya
(74) *Attorney, Agent, or Firm*—Perkins Coie, LLP

(57) ABSTRACT

The scheme for detecting the plug-in status by using single bit generated by a network with serial resistors, comprising a plurality of jacks having a spring switch, wherein the number of the plurality of jacks can be selected depending on the demand and a plurality of resistors followed the spring switch and connected in serial. Output voltage-generating resistor is coupled to the plurality of resistors in parallel to obtain the output voltage, thereby determining the plug-in status. Wherein the plurality of jacks and the plurality of resistors construct a multi-jack network, a first terminal of the multi-jack network refers to a common node between a first connecting terminals of the spring switch of the plurality of jacks and a first resistor of the plurality of resistors, the first terminal being coupled to a first reference voltage, a second terminal of the multi-Jack network refers to a common node between the second connecting terminals of the last jack and the last resistor. Wherein the output voltage-generating resistor is coupled between the second terminal of the multi-jack network and a second reference voltage.

5 Claims, 4 Drawing Sheets

| JACK 1 | JACK 2 | JACK 3 | JACK 4 | X / X UPPER LOWER | READBACK OUTPUT LEVEL |
|---|---|---|---|---|---|
| 0 | 0 | 0 | 0 | 0:R | 1/1 |
| 0 | 0 | 0 | 1 | R:R | 1/2 |
| 0 | 0 | 1 | 0 | 2R:R | 1/3 |
| 0 | 0 | 1 | 1 | 3R:R | 1/4 |
| 0 | 1 | 0 | 0 | 4R:R | 1/5 |
| 0 | 1 | 0 | 1 | 5R:R | 1/6 |
| 0 | 1 | 1 | 0 | 6R:R | 1/7 |
| 0 | 1 | 1 | 1 | 7R:R | 1/8 |
| 1 | 0 | 0 | 0 | 8R:R | 1/9 |
| 1 | 0 | 0 | 1 | 9R:R | 1/10 |
| 1 | 0 | 1 | 0 | 10R:R | 1/11 |
| 1 | 0 | 1 | 1 | 11R:R | 1/12 |
| 1 | 1 | 0 | 0 | 12R:R | 1/13 |
| 1 | 1 | 0 | 1 | 13R:R | 1/14 |
| 1 | 1 | 1 | 0 | 14R:R | 1/15 |
| 1 | 1 | 1 | 1 | 15R:R | 1/16 |

( 0 = unplugged, 1 = plugged )

STRUCTURE FOR DETECTING PLUG/UNPLUG STATUS OF PHONE-JACKS BY SINGLE BIT GENERATED BY A RESISTOR NETWORK

TECHNICAL FIELD

The present invention relates to a detecting scheme for detecting the plug/unplug status of phone-jacks, and specifically, to a structure of detecting the status by using single bit generated by a resistor network.

BACKGROUND

Currently, most of the visual and audio equipments exhibit a plurality of terminals or plugs for receiving external device to input or output signal. The popular application is the micron phone-jacks, especially for the usage for the computer system. Such terminal not only has small size but also occupied a small space. In order to detect whether the plug is set on the jack or not, a typical phone-jack with spring switch is used. Please referring to FIG. 1a, it shows the prior art structure for the detecting purpose. The phone-jack includes connecting terminals 1 and 2 that are referred to the spring switch. Connecting terminals 3 and 4 are the signal contacts and the connecting terminal 5 are the common reference contact for the signal contacts 3 and 4. The spring switch is typically designed on the status of open when a device is plugged into the jack, otherwise the status is short circuit, as shown in FIG. 1b. It illustrates when a device is plugged into the phone-jack. In the prior art, a resistor and a reference voltage VDD are added into the structure (please refer to FIGS. 1a and 1b). The status is detected by the "Readback" node. In the case, if there is no any device connects to the jack 1, the aforementioned spring switch is coupled to the "ground", thereby the "ground voltage" is detected on the node of "Readback". On the contrary, a VDD is detected on the node of "Readback" by coupling the 10K ohms resistor. If the statuses are changed to inverse to the status mentioned above, namely, the status is short circuit when a device is plugged into, the status of the "Readback" node are inverse to the mentioned statuses. The system will obtain the phone-jack 1 status by detecting the "Readback" node. The prior detecting method needs a "Readback" node for each phone-jack. Thus, the number of the "Readback" node is increased along with the increasing number of the phone-jack.

If the detecting circuits are integrated in a single chip, a plurality of the "Readback" node must be formed in such single chip. The situation raises the cost of the manufacture. The present invention discloses a structure of detecting the status by using single bit generated by a resistor network.

The present invention is suitable for the computer system, it also can be used in other system.

SUMMARY

The object of the present invention is to provide a structure of detecting the status by using single bit generated by a resistor network.

The scheme for detecting the plug-in status by using single bit generated by a network with serial resistors, comprising:

a plurality of jacks having a spring switch, wherein the umber of the plurality of jacks can be selected depending on the demand;

a plurality of resistors followed the spring switch and connected in serial;

output voltage-generating resistor coupled to the plurality of resistors in parallel to obtain the output voltage, thereby determining the plug-in status;

wherein the plurality of jacks and the plurality of resistors construct a multi-jack network, a first terminal of the multi-jack network refers to a common node between a first connecting terminals 1 of the spring switch of the plurality of jacks and a first resistor of the plurality of resistors, the first terminal being coupled to a first reference voltage, a second terminal of the multi-jack network refers to a common node between the second connecting terminals of the last jack and the last resistor, wherein the output voltage-generating resistor is coupled between the second terminal of the multi-jack network and a second reference voltage.

Wherein the first reference voltage is VDD or ground. The second reference voltage is ground or VDD. 4. The scheme of claim 1, wherein each one of the plurality of jack includes a first and a second connecting terminals to form the spring switch, a third and a forth connecting terminals for the signal contacts and a fifth connecting terminal act as a common reference contact for the signal contacts.

The further scheme for detecting the plug-in status by using single bit generated by a network with serial resistors, comprising:

a plurality of jacks having a spring switch, wherein the number of the plurality of jacks can be selected depending on the demand;

a plurality of resistors followed the spring switch and connected in parallel;

output voltage-generating resistor coupled to a common node of the plurality of resistors in serial;

a first reference voltage coupled to a further end of the output voltage-generating resistor;

a second reference voltage coupled to one end of each one of the spring switch;

wherein the plurality of resistors coupled to an output voltage to obtain an output voltage, thereby determining the plug-in status.

The yet further scheme for detecting the plug-in status by using single bit generated by an active network with serial resistors, comprising:

a plurality of jacks having a spring switch, wherein the number of the plurality of jacks can be selected depending on the demand;

a plurality of resistors followed the spring switch and connected in serial;

output voltage-generating resistor connected between a first reference voltage and a first node, wherein the first node refers to a first common node between a first terminal of a first resistor and the first reference voltage;

an inverse amplifier (OPA) having a first end connecting to the first node, a second end connecting to the second reference voltage, and a third end connecting to a second node, wherein the second node refers to a second common node between the last jack's connecting terminal and the corresponding resistor; and output voltage node coupled to the second node.

Wherein the first reference voltage is VDC (voltage of direct current) or ground. The second reference voltage is ground or VDC.

The fourth scheme for detecting the plug-in status by using single bit generated by an active network with parallel resistors, comprising:

a plurality of jacks having a spring switch, wherein the number of the plurality of jacks can be selected depending on the demand;

a plurality of resistors followed the spring switch and connected in parallel;

output voltage-generating resistor coupled to the a plurality of resistors via a first end of the output voltage-generating resistor;

an inverse amplifier (OPA) having a first end connecting to a first reference voltage, a second end connecting to the first end of the output voltage-generating resistor, and a third end connecting to a second node of the output voltage-generating resistor;

a second reference voltage coupled to one end of the plurality of jacks.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1A:
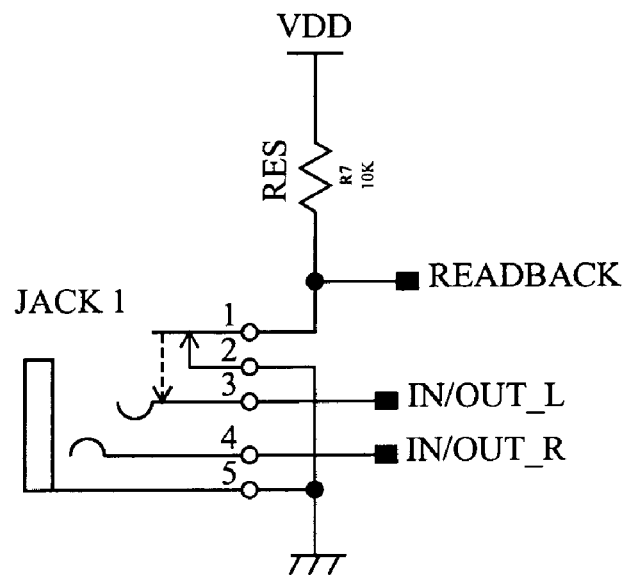
FIGS. 1a and 1b are schemes of the structure for detecting the status in accordance with the prior art.
Figure 1B:
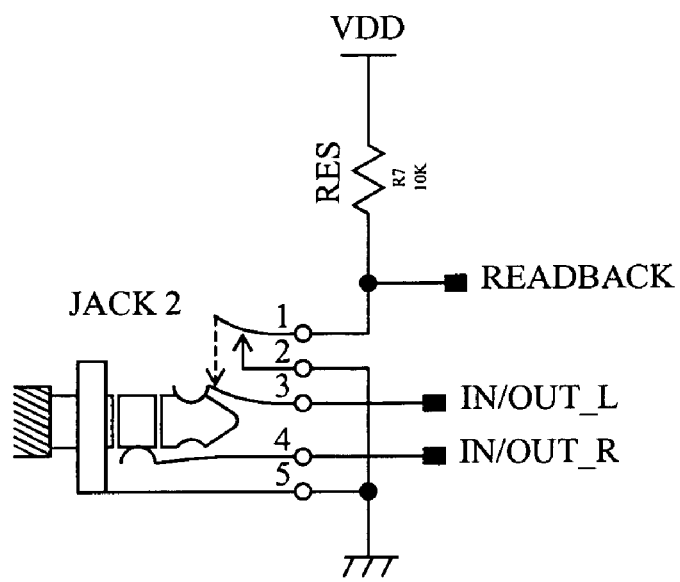
Figure 2:
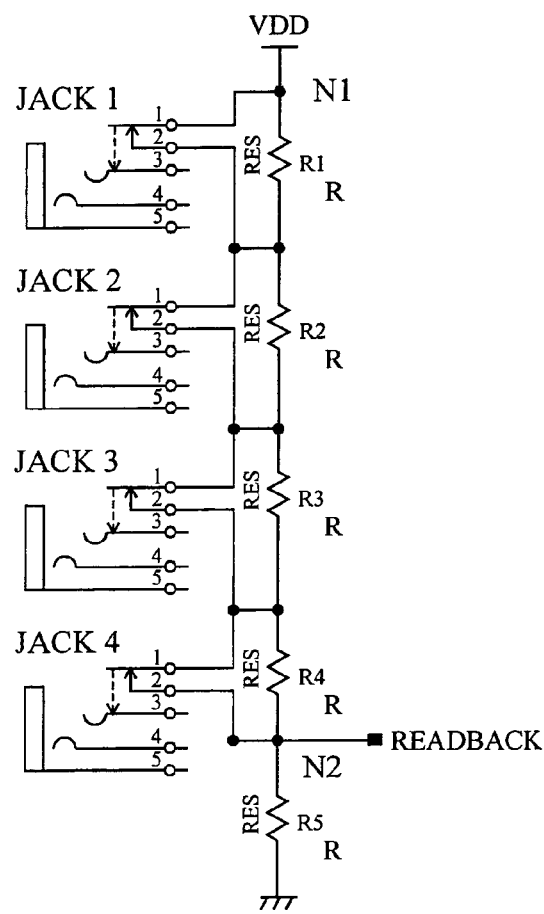
FIG. 2 is a scheme of the of structure for detecting the status by using single bit generated by a network with serial resistors in accordance with the present invention.

Turning to FIG. 2, a scheme of the present invention is depicted. The circuit includes four jacks, the number of the jack can be selected depending on the demand. In the scheme, resistors R1, R2, R3, R4 are follows the spring switch of the jacks and serially connected together. The status of the jacks will determine the status of the resistors R1, R2, R3, R4 is serially coupled or not, and then coupling to the resistor R5, thereby obtaining the output voltage of the node of the "Readback".

The each jack includes connecting terminals 1 and 2 that are referred to the spring switch. Connecting terminals 3 and 4 are the signal contacts and the connecting terminal 5 are the common reference contact for the signal contacts 3 and 4. Each spring switch of the jack is parallelly connected to the resistor R1, R2, R3, R4. The jacks and the resistors construct the multi-jack network. The first terminal N1 of the multi-jack network refers to the common node between the first connecting terminals 1 of the spring switch of the jack and the resistor R1. The first terminal N1 is coupled to the first reference voltage, such s VDD. The second terminal N2 of the multi-jack network refers to the common node between the second connecting terminals 2 of the forth jack and the resistor R4. A further second reference voltage is ground voltage. A fifth resistor R5 is coupled between the second terminal N2 and the fifth resistor R5. By detecting the voltage of the node "Readback" via the fifth resistor R5, the jack plug-in status can be determined.

The aforementioned case uses four jacks as the example. The user may select any number of the jack to meet one's requirement. In one embodiment, the five resistors R1, R2, R3, R4, R5 approximately have the similar resistance. It has to be note, the above embodiment can be accurately work by switching the reference voltage VDD and ground voltage. It still covers by the scope of the present invention. If all of the four jacks are plugged by external devices, the "Readback" node is coupled to the VDD via the four serially connected spring switches. According to the circuit theorem, the voltage of the "Readback" node is VDD (or ground by inverse connection). If only one jack is connected to the external device, the "Readback" node is coupled to the VDD via one of the four resistors R1, R2, R3, R4. If the four resistors have the approximately resistance, the "Readback" node voltage is about VDD/2 by coupling to the fifth resistor R5.

If more than one jack is connected to the external devices, according to the circuit theorem, the "Readback" node voltage is lower than VDD/2. Only a comparator is needed, the status of the plugged jack can be determined.

The present invention only needs one "Readback" node, the connecting status of the multi-jack can be detected. In order to distinguish which jack is connected, the resistance of each resistor can be adjustment, thereby generating difference predetermined "Readback" node voltage according to the design. The information provided by the one "Readback" node is similar to the one provided by multi-"Readback" node. However, the present invention may reduce the cost and the space occupied by the multi-"Readback" node.

Figures 3A, 5B:
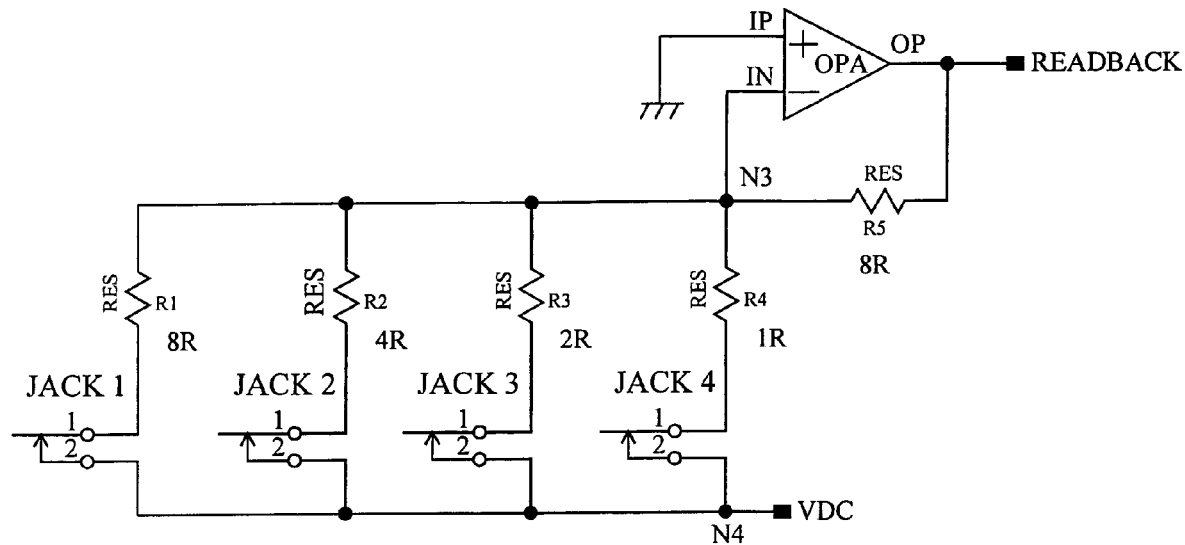
FIG. 3a is a true table according to the scheme of FIG. 2 in accordance with the present invention.
FIG. 5b is active network with paralleled connecting resistor. The four resistors are connected in parallel.

FIG. 3a is a true table for the case in FIG. 2. The resistance of R1 is adjusted to 8 R, the resistance of R2 is adjusted to 4 R and the resistance of R3 is adjusted to 2 R. The ones of the resistance of R4, R5 are maintained the same. When the jack 4 is plugged into the external device, the R1, R2, R3 are short circuits with the spring switches. The "Readback" node voltage is VDD/2 due to the resistors R4 and R5 are not short circuits. Alternatively, the jack 3 is plugged into the external device, then the R1, R2, R4 are short circuits with the spring switches. The "Readback" node voltage is VDD/3 according to the circuit theorem. Therefore, the output signal is different depending on the status of the plugged jack. Under the design and arrangement, the status of which jack is connected can be determined. If jack 3, 4 are coupled to external devices, according to the circuit theorem, the (R3+R4)=3 R is divided with the R5, the voltage of the "Readback" is equal to VDD/4.

From the true table provided by the FIG. 3a, the present invention lists the possible combination of the four jacks. All of the status may be represented by the output signal. The output signal may be recognized by the ADC. Thus, the present invention provides a structure of detecting the status by using single bit generated by a resistor network. If the resistance of R5 is switched to 4 R, when jack D is plugged, the "Readback" voltage is change from ½ VDD to ⅘ VDD. All of the jacks 1, 2, 3, 4 are connected to the plugs, the "Readback" voltage is change from 1/16 VDD to 4/19 VDD. It is easier to distinguish from other status, thereby increasing the capability of identify for the status. About 35% is raised to distinguish the status of one jack plug and four jacks plug.

Figure 3B:
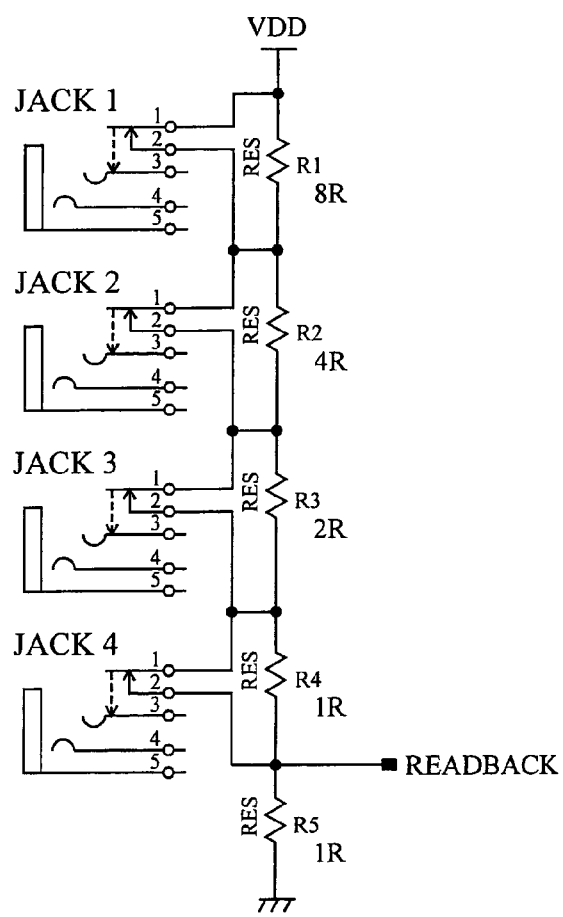
FIG. 3b is a scheme of the structure for detecting the status by using single bit generated by a network with serial resistors in accordance present invention.
Figure 4:
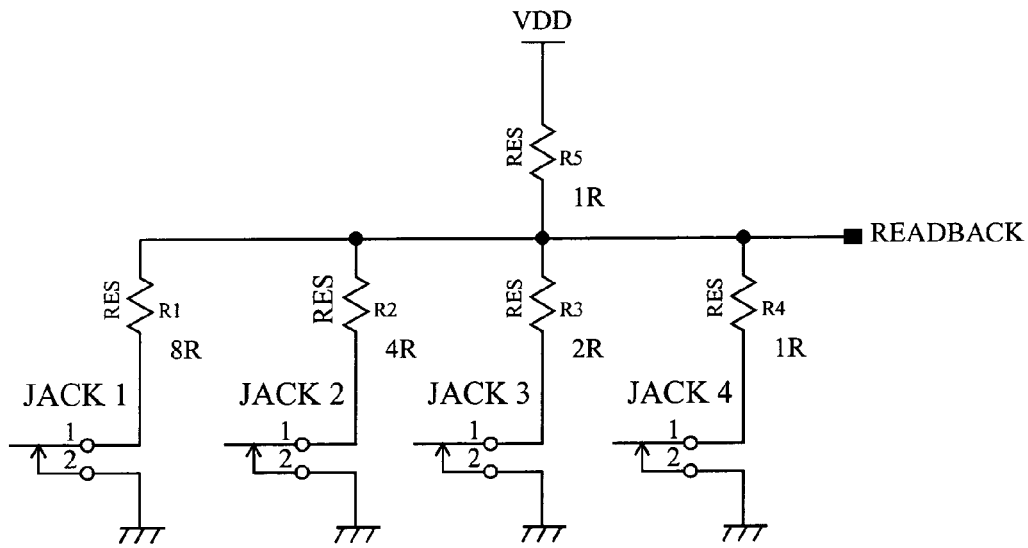
FIG. 4 is a scheme of the of structure for detecting the status by using single bit generated by a network with parallel resistors in accordance with the present invention.

FIG. 3b uses serially connecting resistors to tell from the status, the paralleled resistance scheme can also be used. FIG. 4 is one of the examples, the four resistors R1, R2, R3, R4 followed the correspondence switch are constructs the paralleled connecting circuit.

Figure 5A:
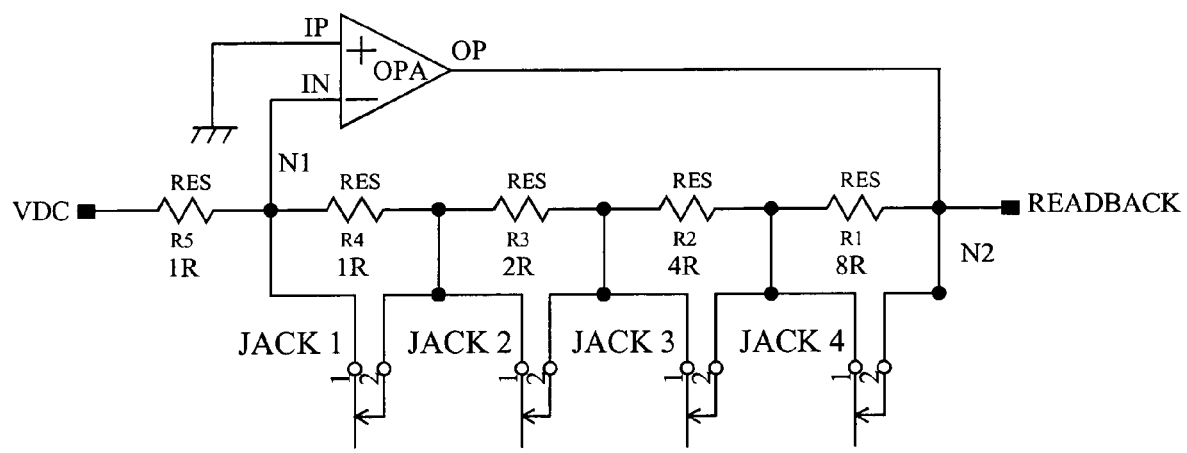
FIG. 5a is active network with paralleled connecting resistor. The four resistors are connected in serial.

The value of the output signal on the true table is not change linearly, a four jacks system has at most 16 combinations. 8-bit resolution ADC is required. An active network introduced into the further embodiment, FIG. 5a is active network with serially connecting resistor.

In the embodiment, each jack includes connecting terminals 1 and 2 that are referred to the spring switch. Connecting terminals 3 and 4 are the signal contacts and the connecting terminal 5 are the common reference contact for the signal contacts 3 and 4 (only the terminals 1 and 2 are shown, others are omitted). It is similar to the FIG. 2, however, the output-generating resistor (fifth resistor) R5 is connected between first reference voltage "VDC (direct current voltage)" and the N1, the N1 refers to the common node between the first terminal of the resistor R4 and the "VDC". The embodiment includes an inverse amplifier (OPA) a first end IN connecting to the N1, a second end IP connecting to the second reference voltage such as "ground", and a third end connecting to the node N2. N2 refers to the common node of the last jack's second connecting terminal and the corresponding resistor. The node "Readback" connects to the node N2.

The direct current voltage "VDC" is used for the OPA to generate an output voltage different from the "ground". The total resistance between the IN and OP ends is determined by the combination of the plug-in jack. The plug-in jack combination is changed lineally, therefore, the output signal of the "Readback" is also changed lineally. Finally, a 4-Bit ADC can be used to determine the status of the four-jack system.

FIG. 5b is active network with paralleled connecting resistor. The four resistors are connected in parallel. The common node N3 of the resistors R1, R2, R3, R4 is coupled to the first end o the fifth resistor R5. The OP end of the OPA is connected to the second end of the resistor R5. The common node N4 of the spring switch of the jacks connects to the VDC. The inverse amplifier (OPA) has a first end IN connecting to the common node N3, a second end IP connecting to the "ground", and a third end OP connecting to the node "Readback". The node "Readback" connects to the node N2. The output-generating resistor (fifth resistor) R5 is connected between the N3 and the node "Readback". The direct current voltage "VDC" is used for the OPA to generate an output voltage different from the "ground". The total resistance between the IN and OP ends is determined by the combination of the plug-in jack. The plug-in jack combination is changed lineally, therefore, the output signal of the "Readback" is also changed lineally. Finally, a 4-Bit ADC can be used to determine the status of the four-jack system.

We claim:

1. A scheme for detecting the plug-in status by using single bit generated by an active network with parallel resistors, comprising:
   a plurality of jacks having a spring switch, wherein the number of said plurality of jacks can be selected depending on the demand;
   a plurality of resistors followed said spring switch and connected in parallel;
   output voltage-generating resistor coupled to said a plurality of resistors via a first end of said output voltage-generating resistor;
   an inverse amplifier (CPA) having a first end connecting to a first reference voltage, a second end connecting to said first end of said output voltage-generating resistor, and a third end connecting to a second node of said output voltage-generating resistor;
   a second reference voltage coupled to one end of said plurality of jacks.

2. The scheme of claim 1, wherein said first reference voltage is ground.

3. The scheme of claim 1, wherein said second reference voltage is ground or direct current voltage (VDC), wherein said direct current voltage "(VDC)" is used for the inverse amplifier (OPA) to generate an output voltage different from the "ground".

4. The scheme of claim 1, wherein each one of said plurality of jacks includes a first and a second connecting terminals to form said spring switch, a third and a forth connecting terminals for the signal contacts and a fifth connecting terminal act as a common reference contact for said signal contacts.

5. The scheme of claim 1, wherein said plurality of resistors comprises at least four resistors, wherein the second resistor (2R) has an ohmic value twice then first resistor (R), the third resistor (4R) has an ohmic value four times the first resistor (R), the fourth resistor (8R) has an ohmic value eight times the first resistor (R).

* * * * *